(12) United States Patent
Lee et al.

(10) Patent No.: US 12,317,672 B2
(45) Date of Patent: May 27, 2025

(54) DISPLAY DEVICE FOR PREVENTING SEPARATION OF BLACK MATRIX THEREFROM

(71) Applicant: LG DISPLAY CO., LTD., Seoul (KR)

(72) Inventors: Gyeo-Re Lee, Paju-si (KR); Yong-Sang Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/102,038

(22) Filed: Jan. 26, 2023

(65) Prior Publication Data

US 2023/0171986 A1   Jun. 1, 2023

Related U.S. Application Data

(63) Continuation of application No. 17/123,905, filed on Dec. 16, 2020, now Pat. No. 11,594,703.

(30) Foreign Application Priority Data

Dec. 30, 2019   (KR) ........................ 10-2019-0177835

(51) Int. Cl.
*H10K 50/84*       (2023.01)
*H10K 50/842*      (2023.01)
(Continued)

(52) U.S. Cl.
CPC ....... *H10K 50/8426* (2023.02); *H10K 50/844* (2023.02); *H10K 59/122* (2023.02); *G02F 1/133331* (2021.01); *G02F 1/136209* (2013.01); *H10D 30/6755* (2025.01); *H10K 50/15* (2023.02); *H10K 50/16* (2023.02);
(Continued)

(58) Field of Classification Search
CPC ............ H10K 50/8426; H10K 50/844; H10K 50/816; H10K 50/828; H10K 50/8445; H10K 50/865; H10K 50/15; H10K 50/16; H10K 50/17; H10K 50/171; H10K 59/122; H10K 59/35; H10K 59/126; H10K 59/00; H10K 2102/00; H10K 2102/311; H10K 59/8792; H10K 50/171842; H10K 59/871; H10K 59/8722; H10K 59/8731;
(Continued)

(56) References Cited

U.S. PATENT DOCUMENTS 9,673,418 B2 *   6/2017   Lim .................. H10K 50/8426
2002/0163016 A1*  11/2002  Shibata ............... H01L 27/1255
                                                            257/200
(Continued)

FOREIGN PATENT DOCUMENTS

WO   WO-2015055099 A1 *  4/2015 ....... G02F 1/133512

*Primary Examiner* — Ida M Soward
(74) *Attorney, Agent, or Firm* — Morgan, Lewis & Bockius LLP

(57) ABSTRACT

An display device includes a cover window including a display area and an attaching area, at least one display panel in the display area of the cover window, a first black matrix in an edge area of the display area and the attaching area, a second black matrix in the attaching area over the first black matrix, and an adhesive on the second black matrix, wherein a first difference of coefficient of thermal expansion between the second black matrix and the adhesive is small than a second difference of coefficient of thermal expansion between the first black matrix and the adhesive.

20 Claims, 4 Drawing Sheets

(51) Int. Cl.

| | |
|---|---|
| *H10K 50/844* | (2023.01) |
| *H10K 59/12* | (2023.01) |
| *H10K 59/122* | (2023.01) |
| *G02F 1/1333* | (2006.01) |
| *G02F 1/1362* | (2006.01) |
| *H10D 30/67* | (2025.01) |
| *H10K 50/15* | (2023.01) |
| *H10K 50/16* | (2023.01) |
| *H10K 50/17* | (2023.01) |
| *H10K 50/816* | (2023.01) |
| *H10K 50/828* | (2023.01) |
| *H10K 59/126* | (2023.01) |
| *H10K 59/35* | (2023.01) |
| *H10K 102/00* | (2023.01) |

(52) U.S. Cl.
CPC ............ *H10K 50/17* (2023.02); *H10K 50/171* (2023.02); *H10K 50/816* (2023.02); *H10K 50/828* (2023.02); *H10K 50/8445* (2023.02); *H10K 59/126* (2023.02); *H10K 59/35* (2023.02); *H10K 2102/00* (2023.02); *H10K 2102/311* (2023.02)

(58) Field of Classification Search
CPC .............. H10K 59/12; G02F 1/133331; G02F 1/136209; G02F 1/133512; H01L 29/7869
See application file for complete search history.

(56) References Cited

U.S. PATENT DOCUMENTS

| | | | |
|---|---|---|---|
| 2004/0105056 A1* | 6/2004 | Iida | G02F 1/133553 349/113 |
| 2004/0114075 A1* | 6/2004 | Iwasa | G02F 1/136209 349/113 |
| 2007/0002257 A1 | 1/2007 | Oh et al. | |
| 2008/0090054 A1* | 4/2008 | Koshizuka | G06V 40/1329 430/322 |
| 2010/0038739 A1* | 2/2010 | Sugio | H01L 23/552 257/435 |
| 2012/0075838 A1* | 3/2012 | Lee | G02F 1/133308 359/601 |
| 2014/0267989 A1* | 9/2014 | Kondo | G02F 1/133308 349/110 |
| 2015/0103053 A1* | 4/2015 | Lin | G06F 3/0412 345/175 |
| 2015/0132520 A1* | 5/2015 | Han | B32B 37/12 156/60 |
| 2015/0380474 A1* | 12/2015 | Lee | H10K 50/865 257/40 |
| 2016/0077642 A1* | 3/2016 | Kim | G06F 3/04164 345/173 |
| 2016/0293895 A1* | 10/2016 | Kim | H10K 50/8428 |
| 2016/0300889 A1* | 10/2016 | Kim | H10K 71/00 |
| 2017/0068128 A1* | 3/2017 | Lim | G02F 1/133512 |
| 2017/0242543 A1* | 8/2017 | Chan | G06F 3/044 |
| 2018/0005007 A1* | 1/2018 | Du | H10K 30/88 |
| 2018/0150170 A1* | 5/2018 | Oh | H10K 50/805 |
| 2018/0190923 A1* | 7/2018 | Heo | H10K 50/11 |
| 2019/0115411 A1* | 4/2019 | Park | G06F 3/0412 |
| 2019/0129510 A1* | 5/2019 | Wang | G06F 3/042 |
| 2019/0131374 A1 | 5/2019 | Kishimoto | |
| 2019/0219861 A1* | 7/2019 | Sawasaki | G02F 1/133512 |
| 2019/0229141 A1* | 7/2019 | Kim | H01L 27/14621 |
| 2019/0245026 A1 | 8/2019 | Woo et al. | |
| 2020/0144341 A1* | 5/2020 | Choi | H10K 59/122 |
| 2020/0183230 A1* | 6/2020 | Ryu | G02F 1/133602 |
| 2021/0327333 A1* | 10/2021 | Cai | G09G 3/2074 |
| 2021/0359272 A1* | 11/2021 | Li | H10K 50/854 |

* cited by examiner

DISPLAY DEVICE FOR PREVENTING SEPARATION OF BLACK MATRIX THEREFROM

CROSS-REFERENCE TO RELATED APPLICATION

This application is a continuation of co-pending U.S. patent application Ser. No. 17/123,905, filed on Dec. 16, 2020, which claims priority to and the benefit of Korean Patent Application No. 10-2019-0177835, filed on Dec. 30, 2019. The disclosure of each of the above prior U.S. and Korean patent applications is incorporated herein by reference in its entirety.

BACKGROUND

1. Technical Field

This invention is related to a display device, more particularly, to a display device for preventing separation of a black matrix therefrom.

2. Discussion of the Related Art

Since a flat panel display device can be made of small and light display device, the flat panel display device can be applied to various electronics products such as a monitor of a desktop computer, a notebook computer, and a mobile phone. The flat panel display device includes a Liquid Crystal Display device, a Plasma Display Panel, a Field Emission Display device, and an Organic light Emitting Diode display.

The flat panel display device is generally used in TV and computer monitor, but in recent years, they are widely used for user interfaces of portable display device and other electronic devices. In particular, as IT technology develops, it is widely used as a wearable electronic device or a dashboard for automobile.

In order to install the display device to the wearable electronic device or the automobile, the display device should be attached to the wearable electronic device or the automobile with an adhesive. At this time, the adhesive is deposited on a black matrix in an outer area of the display panel and then the display panel is attached to the wearable electronic device or the automobile. When a black ink is coated to form the black matrix in this process, however, a pinhole to which ink is not applied may occur in the black matrix in dependent upon a viscosity or process conditions of black ink. This pinhole causes the defect such as a light leakage.

SUMMARY

Accordingly, embodiments of the present disclosure are directed to a display device that substantially obviates one or more of the problems due to limitations and disadvantages of the related art.

An aspect of the present disclosure is to provide a display device in which a plurality of black matrices having different coefficient of thermal expansion to prevent tearing off the black matrix by thermal shock.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display device comprises a cover window including a display area and an attaching area, at least one display panel in the display area of the cover window, a first black matrix in an edge area of the display area and the attaching area, a second black matrix in the attaching area over the first black matrix, and an adhesive on the second black matrix, wherein a first difference of coefficient of thermal expansion between the second black matrix and the adhesive is small than a second difference of coefficient of thermal expansion between the first black matrix and the adhesive.

The cover window may be made of a glass or a polymer material and include spherical or aspherical surface.

The first black matrix is composed of two layers and the ends of the first black matrices are space apart to each other. Further, the second black matrix is composed of single layer or multi layers and the ends of a plurality of the second black matrices are space apart to each other.

The adhesive is made of an urethane based material, the first black matrix is made of a polyester based material and the second black matrix is made of an epoxy based material or an acryl based material.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
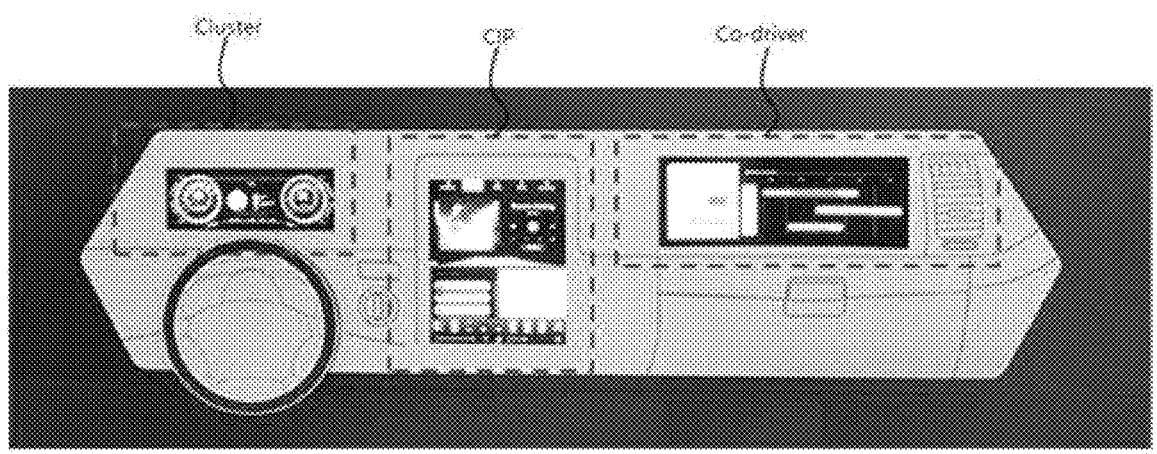
FIG. 1 is a view illustrating a dashboard of an automobile according to the invention.

Advantages and technical features of the present disclosure, and methods for achieving the advantages and the technical features will be clarified with reference to embodiments described below in detail together with the accompanying drawings. However, the present disclosure is not limited to the embodiments disclosed below, but will be implemented in various different forms. The embodiments allow the disclosure of the present disclosure to be complete and the ordinary skilled in the art to fully understand. The present disclosure is only defined by the scope of the claims.

The shapes, sizes, ratios, angles, numbers, etc., disclosed in the drawings for describing the embodiments of the present invention are exemplary, and the present invention is not limited to the drawings. The same reference numerals refer to the same components throughout the specification. In addition, in the description of the present disclosure, when it is determined that detailed descriptions of related known technologies may unnecessarily obscure the subject matter of the present disclosure, detailed descriptions thereof will be omitted. When 'include', 'have', 'consist of', etc., are used in this specification, other parts may be added unless 'only' is used. When a component is expressed as a singular number, the plural number is included unless otherwise specified.

In interpreting the components, it is interpreted as including the error range even if there is no explicit description.

In the case of the description of the positional relationship, for example, when the positional relationship of two parts is described as 'on', 'over', 'under', 'at a side', etc., one or more other parts may be positioned between the two parts unless 'right' or 'direct' is used.

In the case of the description of the temporal relationship, for example, when the temporal order relationship is described as 'after', 'continually', 'next', 'before', etc., discontinuous cases may be included unless 'right' or 'direct' is used.

Terms 'first', 'second', etc., are used to describe various components, but these components are not limited by these terms. These terms are only used to distinguish one component from another component. Accordingly, the first component mentioned below may be the second component within the technical spirit of the present disclosure.

In describing the components of the present disclosure, terms of 'first', 'second', 'A', 'B', '(a)', '(b)', etc. may be used. These terms are only used to distinguish the component from other components, and the nature, turn, order, or number of the component is not limited by the terms. When a component is described as being "connected", "combined" or "contacted" to another component, the component is directly connected or contacted to the another component, but it is to be understood that another component may be "interposed" between the components or the components may be "connected", "combined" or "contacted" through another component.

In the present disclosure, a "display device" may include a narrow-sense display device including a display panel and a driving portion for driving the display panel such as a liquid crystal module (LCM), an organic light-emitting module (OLED module), and a quantum dot module. In addition, the display device may include a complete product or final product including an LCM, an OLED module or a QD module such as a notebook computer, a television, a computer monitor, an equipment display including an automotive display device or a different type of vehicle, a set electronic device such as a mobile electronic device of a smartphone or an electronic pad, or a set device or set apparatus.

Accordingly, the display device of the present disclosure may include a narrow-sense display device itself such as an LCM, an OLED module or a QD module and an applied product or a set device that is a final consumer device including an LCM, an OLED module or a QD module.

Additionally, in some cases, an LCM, an OLED module or a QD module composed of a display panel and a driving portion may be expressed as a narrow-sense "display device", and an electronic device as a complete product including an LCM, an OLED module or a QD module may be separately expressed as "a set device." For example, the narrow-sense display device may include a display panel such as a LC panel, an OLED panel or a QD panel and a source PCB that is a control unit for driving the display panel, and the set device may be a concept that further includes a set PCB, which is a set control unit electrically connected to the source PCB to control the entire set device.

The display panel used in the embodiment of the present disclosure may include all types of display panels such as a liquid crystal display panel, an organic light-emitting diode display panel, a quantum dot display panel, or an electroluminescent display panel and is not limited to a specific display panel capable of bending a bezel with a flexible substrate for an OLED display panel of the present embodiment and a backplane support structure thereunder. In addition, the display panel used in the embodiment of the present disclosure is not limited to the shape or size of the display panel.

For example, when the display panel is an OLED display panel, it may include a plurality of gate lines and data lines and pixels formed at crossing areas of the gate lines and the data lines. In addition, it may be configured to include an array including a thin film transistor which is an element for selectively applying a voltage to each pixel, an organic light-emitting device (OLED) layer on the array, an encapsulation substrate or encapsulation layer over the array to cover the organic light-emitting device layer, and so on. The encapsulation layer may protect the thin film transistor and the organic light-emitting device layer from the external impacts and prevent moisture or oxygen from penetrating into the organic light-emitting device layer. Further, an inorganic light-emitting layer formed on the array may include a nano-sized material layer or a quantum dot, for example.

Hereinafter, the invention will be described in detail accompanying the drawings.

This invention provides the heteromorphic display device used for the wearable electronic device or the dashboard of the automobile. The wearable electronic device or the dashboard of the automobile is formed in various shapes because not only functional aspects but also design elements are important. Thus, display devices applied to the wearable electronic devices or the dashboards of automobile must also be formed in various shapes.

For example, the wearable electronic devices or the dashboards of automobile may be formed in a circular or round shape of a curved surface with a constant curvature. Further, the wearable electronic devices or the dashboards of automobile may be formed as a spherical or aspherical surface such as the circular or round shape having the different curvature throughout. Therefore, the display device applied to the wearable electronic devices or the dashboards of automobile may also be manufactured in a form capable of being flexible or curved in various shapes and then this display device is attached to the wearable electronic devices or the dashboards of automobile.

Although this display device is applied in various electronic products, the display device applied to the dashboards of automobile will be described below for convenience of description.

FIG. 1 shows the dashboards of automobile according to the invention.

Initially, the dashboards of automobile displayed information such as simple number of the speed and RPM of the automobile and warning lights. However, in recent years, as information is digitalized with the development of IT technology and new automobile such as smart cars, connected cars, and even autonomous automobile appear, various information on the automobile needs to be displayed. For example, the recent dashboard should display various motions and situations of the automobile such as distance from the automobile in front, pedestrian recognition, automobile approach warning, cruise driving information, lane maintenance assist function, autonomous driving, etc.

Moreover, as the time spent in the automobile increases, the automobile is not a simple means of transportation, but an entertainment function that provides various audio-visual contents is increasing. For example, the display device provides movies, music, and entertainment such as games to the passenger.

The dashboard for providing these various information is gradually developing into an analog dashboard using gauges and needles made of instruments, a hybrid dashboard in which a small display device is inserted into the analog dashboard, and a digital cluster in which the entire dashboard is formed in a digital display device.

Analog dashboard is difficult to modify or change because all numbers, scales, and needles are made of real objects. On the other hand, in the digital dashboard, the screen of the dashboard can variously change according to the situation or driving mode of the driver and automobile.

As shown in FIG. 1, the dashboard of the invention is made of the display device 1 and the display device 1 is formed in a gauge cluster and a center fascia.

The display device 1 includes a cluster, a CID (Center Information Display), and a co-driver display to provide the various information to the driver and all passengers in the automobile. The cluster is disposed in front of a driver to provide information, such as the automobile operation information of the automobile speed and automobile RPM, various warning lights, automobile approach warning, cruise driving information, lane maintenance assistance function, autonomous driving, etc., to the driver. The CID is disposed in the center of the front of the automobile to display the automobile information such as temperature inside and outside of the automobile and a navigation information and to combine the mobile phone to the system of the automobile. The co-driver display provides the services such as video, sound, and games to passengers.

Although the cluster, the CID, and the co-driver display is formed as one display device in figure, the display devices for the cluster, the CID, and the co-driver can be separately formed in the gauge cluster and the center fascia.

Further, only the cluster and the co-driver display are formed as one display device and the CIP is separately formed in the center fascia. In this case, the cluster and the co-driver display are provided by the display device manufacturer, and the CIP that displays vehicle information and connects to external devices such as mobile device or audio device is installed by the vehicle manufacturer. Thus, various types of the dashboard may be produced to highlight the personality of vehicle companies.

Various display devices may be applied to this invention. For example, the flat panel display device such as a liquid crystal display device or an organic light emitting display device may be applied as the display device 1 of this invention.

Since the display device 1 of this invention is installed in the gauge cluster and the center fascia of the automobile, the display device may be formed in the various shapes according to the kind of the automobile. For example, the display device 1 may be formed in a curved shape depending upon the shapes of the gauge cluster and the center fascia. In order to manufacture the display device of the various shapes, the display device 1 should be formed in the flexible display device or curved display device.

Further, the display device 1 of the automobile should not only provide simple information such as automobile information or driving information, but must provide a service images such as movies or games to the passenger through the co-driver display device. Therefore, the display device 1 has to display the high-quality images.

In addition, since the power is supplied to the display device 1 from a battery of the automobile, it is necessary to minimize power consumption in order to minimize the burden on the battery.

In view of this point, an organic light emitting display device is suitable as the display device 1 of this invention. The organic light emitting display device can be easily manufactured as the flexible and curved display device. Further, the organic light emitting display device has better image quality than other flat panel display devices such as the liquid crystal display device. In addition, the organic light emitting display device can reduce power consumption compared to the liquid crystal display device. Therefore, the organic light emitting display device is suitable as the dashboard of the automobile.

Figure 2:
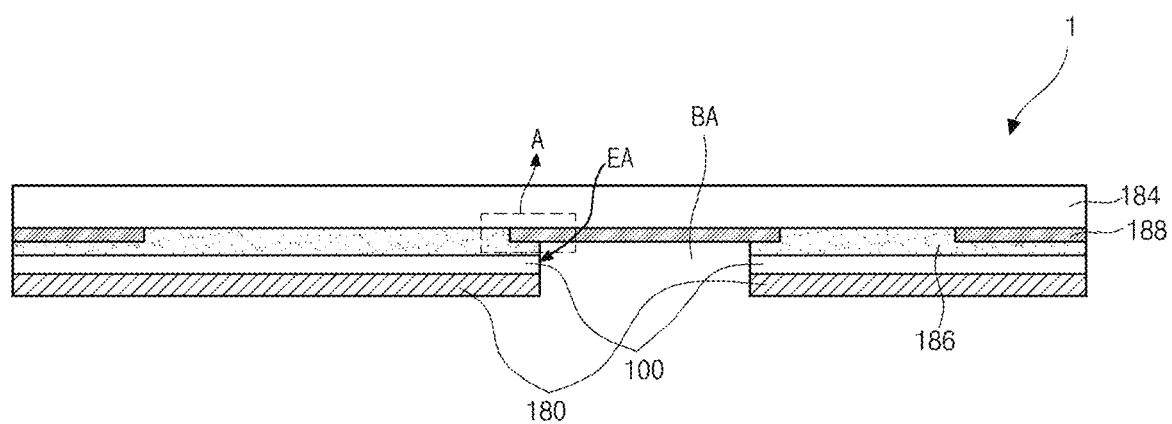
FIG. 2 is a view illustrating a display device according to a first embodiment of the invention.

FIG. 2 is a figure schematically illustrating the display device according a first embodiment of this invention.

As shown in FIG. 2, the display device 1 according to the first embodiment of this invention includes a display panel 100 and a cover window 184 attached to the display panel 100 thereon.

The various display panels may be used as the display panel 100 of this invention. For example, the liquid crystal display panel, the organic light emitting display panel, micro-LED display panel, etc., may be used as the display panel of this invention. Hereinafter, the organic light emitting display panel will be described as the display panel 100 of this invention for convenience of description.

A back plate 180 is disposed at the rear portion of the display panel 100 to protect the display panel 100. Since various parts such as engine are installed in the lower portion of the automobile, an impact or a foreign substance generated from these various parts is applied to the display panel 100 installed inside of the automobile. Thus, the display panel 100 of the automobile is placed in a much harsher external environment than the display panel used in the TV or the computer. The back plate 180 protects the display panel 100 from this harsher external environment.

Not shown in figures, further, the display panel 100 may be the flexible display panel or the curved display panel that includes respectively substrate made of plastic-based material. Since this plastic substrate may be damaged by the external impact, the back plate 180 should be used to protect the substrate.

The back plate 180 may be formed of a metal such as aluminum and stainless steel. However, back plate 180 is not limited to the metal. The back plate 180 may be formed of a polymer-based material such as PMMA (polymethyl methacrylate), PC (polycarbonate), PVA (polyvinylalcohol), ABS (acrylonitirile-butadiene-styrene), PET (polyethylene terephthalate), etc.

In case where the back plate 180 is made of the metal having high conductivity, the back plate 180 may effectively transfer heat generated from the display panel 100 to the outside. At this time, the back plate 180 made of the metal is to be thin enough to be bent.

Not shown in figure, the display panel 100 is attached to the back plate 180 by an adhesive. An optical adhesive such as OCA (optical clear adhesive) may be used as the adhesive of this invention. Further, various adhesive may be used as the adhesive of this invention.

A flexible thin glass may be used as the cover window 184 and the polymer-based material such as PMMA, PC, COP (cycloolefin polymer), PET, PI (polyimide), and PA (polyamide) may be used as the cover window 184.

As shown figure, the display device 1 may be formed by attaching a plurality of display panel 100 to the cover window 184. For example, the display panel 100 may be the cluster, CID, or co driver display of the dashboard.

A black matrix 188 is formed in the edge area EA of the display panel and the area between the display panels 100. The black matrix 188 may be formed by coating and hardening a black ink such polyester, but is not limited thereto.

The black matrix 188 blocks the light from leaking to the edge area EA of the display panel 100 and the area between the display panels 100 when the display device 1 is installed inside the automobile.

The display panel 100 is attached to the cover window 184 by an optical adhesive layer 186. The optical adhesive layer 186 may be made of a transparent adhesive such as OCA or OCR (optical clear resin). The optical adhesive layer 186 is coated between the cover window 184 and the display panel 100.

The area between the display panels 100 is a attaching area BA where the fabricated display device 1 is attached to a set. For example, when the display device of this invention is used for the dashboard of the automobile, the area between the display panels 100 is the attaching area BA attached to the gauge cluster or the center fascia.

The display device 1 is manufactured by the display device manufacturer and then supplied to the automobile manufacturer. In the automobile manufacturer, the display device 1 is installed inside the automobile. The display device 1 is attached with the adhesive. In this case, the adhesive for attaching the display device 1 may be an optical adhesive such as OCA or OCR, or may be a PSA (pressure sensitive adhesive).

Although not shown in figure, the display device 1 may be installed in the automobile by coating the adhesive on the black matrix in the attaching area BA to attach the display device 1 in the gauge cluster or the center fascia.

The adhesive for the display device 1 may be coated in the attaching area BA or the rear surface of the back plate 180 in the display area AA in accordance with the shape of the gauge cluster, the center fascia, or the display device 1.

Figure 3:
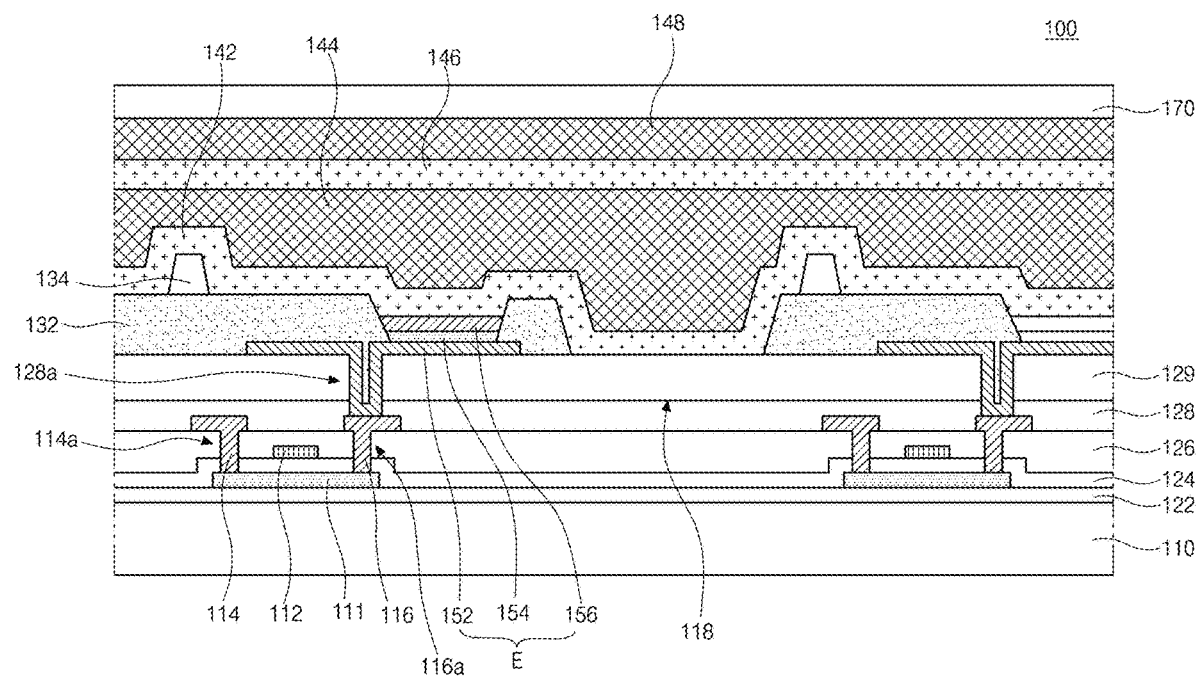
FIG. 3 is a cross sectional view of a display panel according to the invention.

FIG. 3 is sectional view of the display panel 100 according to this invention. The various display panels may be used as the display panel 100 of this invention. However, hereinafter, the organic light emitting display panel will be described as the display panel 100 of this invention for convenience of description. In this case, the display panel 100 is flexible display panel.

In this invention, as shown in FIG. 3, a buffer layer 122 is formed on a first substrate 110 and a driving thin film transistor (TFT) is formed on the buffer layer 122.

The first substrate 110 is made of transparent and flexible plastic-based material such as polyimide. However, the material of the first substrate 110 is not limited to the plastic-based material. The buffer layer 122 may be formed in single inorganic layer or multi layers having inorganic layer and organic layer. In case where the inorganic layer is made of inorganic material such as SiOx or SiNx, the organic layer is made of organic material such as photo acryl. However, the inorganic layer and the organic layer is not limited to these materials.

Since the buffer layer 122 is formed in the single inorganic layer or the multi-layers having organic layer, it is possible to minimize the penetration of impurities such as air and moisture through plastics that are more vulnerable to air or moisture than glass.

The driving TFT includes a semiconductor layer 111 on the buffer layer 122 in a pixel, a gate insulating layer 124 over the whole area of the first substrate 110, a gate electrode 112 on the gate insulating layer 124, an interlayer 126 over the first substrate 110 to cover the gate electrode 112, and a source electrode 114 and a drain electrode 116 on the interlayer 126 for contacting with the semiconductor layer 111 through contact holes 114a, 116a formed in the gate insulating layer 124 and the interlayer 126.

The semiconductor layer 111 may be formed with a crystalline silicon or an oxide semiconductor material such as IGZO (indium gallium zinc oxide). When the semiconductor layer 111 is formed with the oxide semiconductor material, the oxide semiconductor layer includes a channel layer in a center region thereof and doping layers at both sides of the channel layer. The source electrode 114 and the drain electrode 116 are contacted with the doping layer. The semiconductor layer 111 may be formed with an amorphous silicon or an organic semiconductor material.

The gate electrode 112 is formed in single layer or multi layers made of the metal such as Cr, Mo, Ta, Cu, Ti, Al, or Al alloy. The gate insulating layer 124 is formed in single layer made of the inorganic material such as SiOx or SiNx, or in double inorganic layers made of SiOx and SiNx. The interlayer 126 is formed in the single layer or the multi layers made of the inorganic material such as SiOx or SiNx. However, the interlayer 126 is not limited to these materials.

The source electrode 114 and the drain electrode 116 are made of the metal such as Cr, Mo, Ta, Cu, Ti, Al, or Al alloy, but it is not limited to these metals.

In the description and drawings, the driving TFT is formed in the specific structure, but the driving TFT of this invention is not limited this structure. Any structure of the driving TFT can be applied to this invention.

A passivation layer 128 is formed over the first substrate to cover the driving TFT and a planarization layer 129 is formed on the passivation layer 128.

The passivation layer 128 is formed of the single layer made of the inorganic material and the multi layers made of the inorganic and the organic materials. The planarization layer 129 may be made of the inorganic layer such as photo acryl, but it is not limited to this material.

An organic light emitting element E is formed on the planarization layer 129 and connected to the drain electrode 116 of the driving TFT through a contact hole 128a formed in the passivation layer 128 and the planarization layer 129.

The organic light emitting element E includes a first electrode 152 connected to the drain electrode 116 of the driving TFT through the contact hole 128a, an organic light emitting layer 154 on the first electrode 152, and a second electrode 156 on the organic light emitting layer 154.

The first electrode 152 is formed in the single layer or multi layers made of the metal such as Ca, Ba, Mg, Al, Ag, or alloy thereof. The first electrode 152 is connected to the drain electrode 116 of the driving TFT to be applied with an image signal from the outside. The first electrode 152 acts as a reflective layer to reflect light emitted from the organic light emitting layer 154 in an upper direction (i.e., in a direction opposite to the first substrate 110). Further, the first electrode may be made of transparent metal oxide such as ITO (indium tin oxide) or IZO (indium zinc oxide).

The second electrode 156 is made of the transparent metal oxide such as ITO or IZO, but it is not limited these materials. That is, the second electrode may be formed in the single layer or the multi layers made of the metal such as Ca, Ba, Mg, Al, Ag, or alloy thereof. The second electrode 156 acts as the reflective layer to reflect light emitted from the organic light emitting layer 154 in a lower direction (i.e., in the direction of the first substrate 110).

When the organic light emitting display panel 100 is a lower light emitting display panel in which the light emitted from the organic light emitting layer 154 is output downward, that is, toward the first substrate 110, the first electrode 152 is made of the transparent metal oxide and the second electrode 156 is made of the metal or the metal compound that reflects light. Further, when the organic light emitting display panel 100 is an upper light emitting display panel in which the light emitted from the organic light emitting layer 154 is output upward, the first electrode 152 is made of the metal or the metal compound serving as a reflective film and the second electrode 156 is made of the transparent metal oxide.

The organic light emitting layer 154 includes an R-organic light emitting layer for emitting red monochromatic light, a G-organic light emitting layer for emitting green monochromatic light, and a B-organic light emitting layer for emitting blue monochromatic light which are respectively disposed in R, G, B pixels. Further, the organic light emitting layer 154 may be a W-organic light emitting layer for emitting white light. When the organic light emitting layer 154 is the W-organic light emitting layer, R, G, B color filter layers are formed in the upper region of the W-organic light emitting layer of the R, G, and B pixels to convert white light emitted from the W-organic light emitting layer into red, green, and blue monochromatic light. The W-organic light emitting layer may be formed by mixing a plurality of organic materials each emitting red, green, and blue monochromatic lights, or may be formed by stacking the R-organic light emitting layer, the G-organic light emitting layer, and the B-organic light emitting layer.

The organic light emitting layer 154 may be an inorganic light emitting layer made of an inorganic light emitting material such as a quantum dot.

The organic light emitting layer 154 may include an electron injection layer and a hole injection layer for injecting respectively electrons and holes into the emitting layer, and an electron transport layer and a hole transport layer for transporting respectively the injected electrons and holes to the emitting layer.

A bank layer 132 is formed in the boundary area of the pixel on the planarization layer 129. The bank layer 132 is a barrier to divide each pixel to minimize mix of light of different colors from adjacent pixels.

A first encapsulation layer 142 is formed on the light emitting element E and the bank layer 132. The first encapsulation layer 142 is made of the inorganic material such as SiNx and SiOx, but is not limited to these materials.

A second encapsulation layer 144 made of the organic material is formed on the first encapsulation layer 142 above the light emitting element E. As the second encapsulation layer 144, the organic materials such as PCL (Particle Capping Layer), PET, PEN (Polyethylene naphthalate), PC, PI, polyethylene sulfonate, polyoxymethylene, PAR (polyarylate), and mixed materials thereof may be used.

As shown in the figure, the second encapsulation layer 144 is formed to cover the entire first encapsulation layer 142, but may be formed on the first encapsulation layer 142 in an island shape. In the case where the second encapsulation layer 144 is formed in the island structure, since the area between the second encapsulation layers 144 having the island shape may be bent without stress, the flexible characteristics of the display panel 100 can be improved. In this time, the second encapsulation layers 144 having the island shape is preferably disposed to completely cover the light emitting element E.

A third encapsulation layer 146 is formed over the first encapsulation layer 142 and the second encapsulation layer 144. The third encapsulation layer 144 is made of inorganic materials such as SiNx and SiOx, but is not limited thereto. In this case, the third encapsulation layer 146 is formed to completely surround the top and side surfaces of the second encapsulation layer 144, so that the second encapsulation layer 144 is completely sealed from the outside by the first encapsulation layer 142 and the third encapsulation layer 146.

A transparent filler 148 is coated on the third encapsulation layer 146, and a second substrate 170 is disposed thereon. The first substrate 110 and the second substrate 170 is attached to each other by the filler 148. As the filler 148, any material may be used as long as it has good adhesion, good heat resistance, and water resistance. In this invention, a thermosetting resin such as an epoxy compound, an acrylate compound, or an acrylic rubber may be used as the filler 148. Further, a photo curing resin or a thermosetting resin may be used as the filler 148. In this case, the filler 148 is cured by applying light or heat such as ultraviolet rays.

The filler 148 may not only attach the first substrate 110 and the second substrate 170 together, but also serves as the encapsulation layer for minimizing penetration of moisture into the organic light emitting display panel 100. Therefore, the filler 148 is not limited to terms, and may be called an adhesive or a fourth encapsulation layer.

The second substrate 170 is an encapsulation cap for encapsulating the organic light emitting display panel 100 and is composed of protect film such as a PS (polystyrene) film, a PE (polyethylene) film, a PEN film, or a PI film.

Meanwhile, a spacer 134 having a predetermined width may be formed on the upper surface of the bank layer 132 between the pixels.

Figure 4:
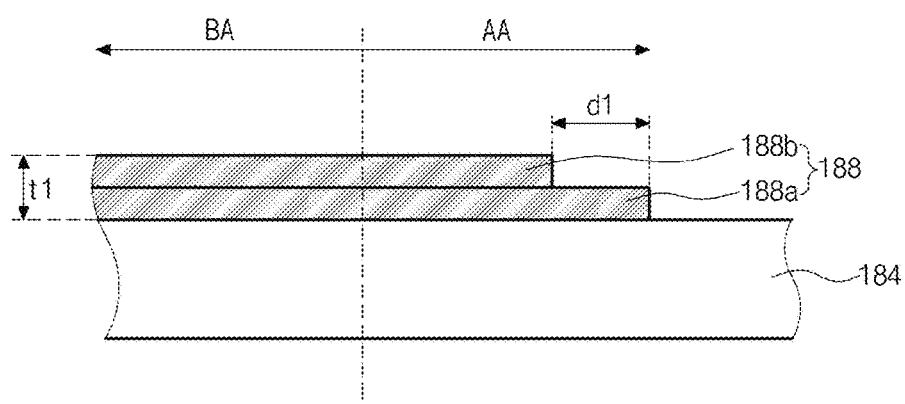
FIG. 4 is an enlarged sectional view of A region of FIG. 2.

The spacer 134 maintains uniform the gap between the mask and the bank layer 132 when the organic light emitting layer 154 is formed by depositing the organic light emitting material using the mask (FMN, Fine Metal Mask). Accordingly, the spacer 134 may be formed in an appropriate pixel in consideration of the load of the mask without having to be formed in all pixels. The spacer 134 may be made of the same material as the bank layer 132, but is not limited thereto and may be made of the different material. When the spacer 134 and the bank layer 132 are made of the same material, the spacer 134 and the bank layer 132 are simultaneously made in the one process by an etching method using a halftone mask or a diffraction mask after applying the organic material. FIG. 4 is an enlarged cross sectional view of area A of FIG. 2 illustrating the structure of the black matrix of the display device 1 according to the first embodiment of this invention.

As shown in FIG. 4, the black matrix 188 of the display device 1 according to the first embodiment of this invention is formed from the display area AA where the display panel 100 is formed to the attaching area BA between the display panels 100. The black matrix 188 includes a first black matrix 188a formed from the display area AA to the attaching area BA on the cover window 184 and a second black matrix 188b on the first black matrix 188a.

In this embodiment, since the black matrix 188 is formed in the double layers, it is possible to prevent the poor print of the ink.

The black matrix 188 is composed of polyester-based black ink, and is formed by coating and curing the black ink on the cover window 184. In the case where the black matrix is formed in the single layer, pinholes that the ink is not coated may generated depending on the viscosity or the process conditions of the ink when the black ink is coated. The pinholes cause the defect of the black matrix 188.

The best way to prevent the pinholes is to coat thick the black ink to form the black matrix of the thick single layer. In this case, however, due to the increase in the thickness of the black matrix 188, the thickness of the display device 1 increases. Further, the manufacturing cost is increased and the defect caused by the step of the black matrix 188 may be occur.

In this invention, the black matrix 188 is formed by coating twice the black ink in order to remove the pinholes. Therefore, in even case where the pinhole is generated in the first black matrix 188a in this embodiment, since the pinhole in the first black matrix 188a is filled with the black ink for the second black matrix 188b, the pinholes is not generated in the entire black matrix 188.

When the black matrix 188 is formed as the single layer, the black matrix must be formed to a thickness of about 20 μm to prevent defects caused by the pinholes. On the other hand, in the display device 1 according to the first embodiment of the invention, the pinholes are not generated even when the first and second black matrices 188a and 188b are formed to have a thickness t1 of about 14-16 μm. Therefore, by forming the black matrix 188 in two layers in the first embodiment of the invention, it is possible to reduce the thickness of the black matrix 188 and prevent pinholes in the black matrix 188.

Further, in this embodiment, since the second black matrix 188b is spaced apart from the end of the first black matrix 188a by the predetermined distance d1, the step due to the black matrix 188 is formed in two steps. Therefore, it is possible to decrease the step compared to the step difference caused by the black matrix of a single layer, thereby minimizing defects due to the step.

Figure 5:
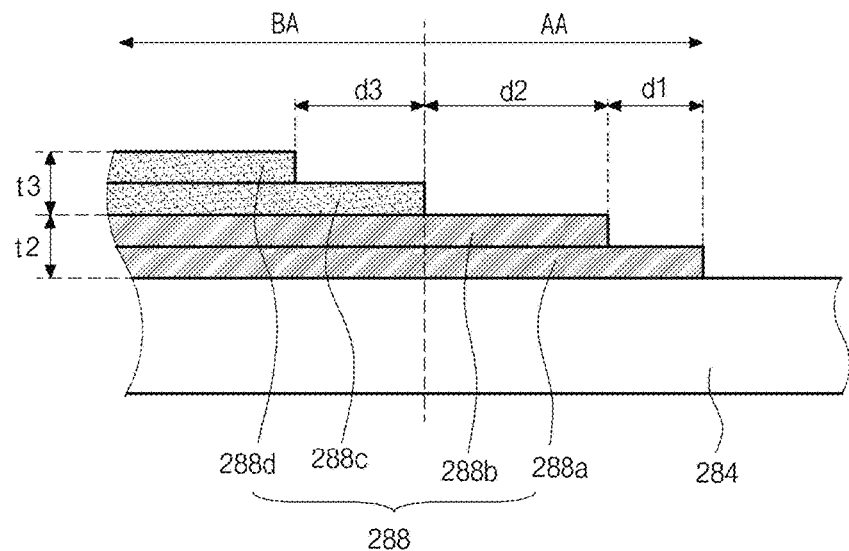
FIG. 5 is a view illustrating structure of the black matrix of the display device according to the second embodiment of the invention.

FIG. 5 is view illustrating the structure of the black matrix 288 according to the second embodiment of the invention.

In the display device according to this embodiment, as shown in FIG. 5, the first black matrix 288a and the second black matrix 288b are formed from the display area AA to the attaching area BA, and a third black matrix 288c and a fourth black matrix 288d are formed in the attaching area BA on the second black matrix 288b. That is, the third black matrix 288c and the fourth black matrix 288d are only in the attaching area BA, not display area AA.

The second black matrix 288b is spaced apart from the end of the first black matrix 288a by the predetermined distance d1 on the first black matrix 288a and the third black matrix 288c is spaced apart from the end of the second black matrix 288b by the predetermined distance d2 on the second black matrix 288b. Further, the fourth black matrix 288d is spaced apart from the end of the third black matrix 288c by the predetermined distance d3 on the third black matrix 288c.

As described above, by forming the black matrix 288 in the four layers structure in the display device of this embodiment, it is possible to prevent the defect occurred in the display device of the first embodiment such as tearing of the black matrix 288, air bubbles in the black matrix 288, and edge strains of screen. Hereinafter, it will be described.

Figure 6:
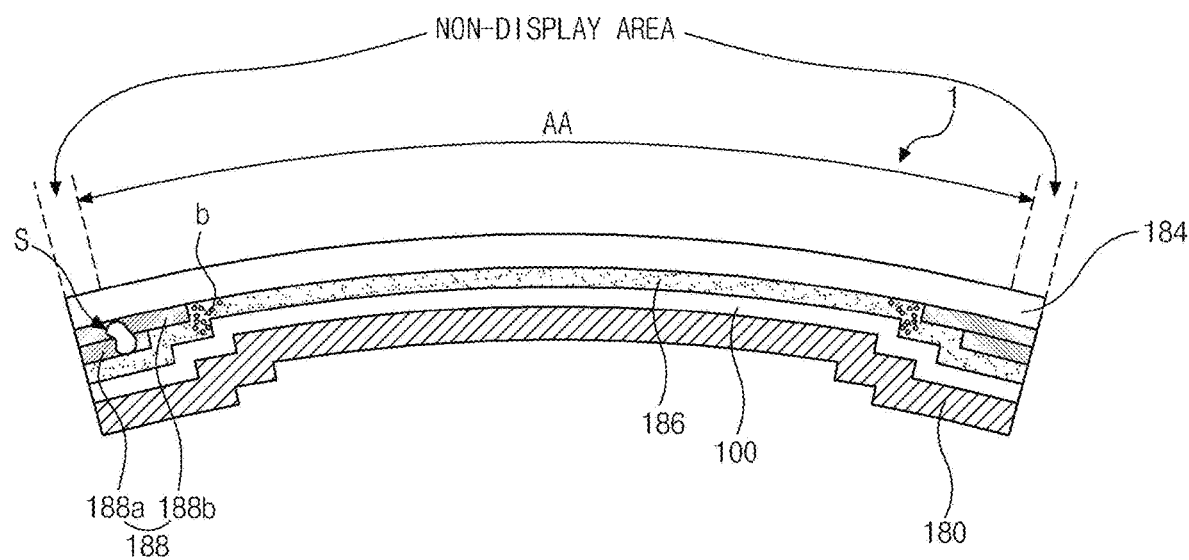
FIG. 6 is a view showing defect in the black matrix according to the first embodiment of the invention.

FIG. 6 is a view illustrating the defect in the black matrix 188 of the display device 1 according to the first embodiment of the invention. In this embodiment, the display device 1 is the curved display device installed on the gauge cluster or the center fascia of the automobile.

As shown in FIG. 6, in the first embodiment, the black matrix 188 is formed in the two layers structure, thereby preventing the pinhole phenomenon that may occur in the single layered black matrix, and relatively reducing the step.

However, in the case of the black matrix 188 having such a structure, when a high temperature thermal shock is applied to the display device for reliability test of a display device in the customer (for example, the automobile manufacturer), the black matrix 188a and 188b may get loose from the adhesive for attaching the display device due to the difference in coefficient of thermal expansion between the adhesive applied to the attaching area and the black matrix 188a and 188b. Thus, the black matrix 188 may be torn off from the display device.

In order to prevent the tearing problem S of the black matrix 188, the black matrix 188 may be formed in three or more layers, but in this case, the step due to the three or more black matrix 188 increases. This step causes stress in the structure of the display device 1 and thus the bubbles are generated in the optical adhesive layer 186 near the black matrix 188. The bubbles b scatters the image output from the display panel 100 to cause poor image quality, and even cause a problem in that the bubbles b are visually recognized on the screen.

Further, some of the light from the display panel 100 is absorbed by the black matrix 188 to generate spots on the screen along the black matrix 188, due to an increase in the step of the black matrix 188.

Referring back to FIG. 5, the second embodiment of this invention can solves the above problems that may occur in the first embodiment.

In the display device according to the second embodiment of the invention, the third black matrix 288c and the fourth black matrix 288d are formed on the second black matrix 288b to prevent tearing off the first black matrix 288a and the second black matrix 288b. That is, since the third black matrix 288c and the fourth black matrix 288d cover the first black matrix 288a and the second black matrix 288b, it is possible to prevent that the first black matrix 288a and the second black matrix 288b are separated and tearing off from the boundary of the adhesive.

In particular, in this embodiment, the first black matrix 288a and the second black matrix 288b are formed in the edge area of the display area AA and the attaching area BA of the display device, whereas the third black matrix 288c and the fourth black matrix 288d are formed only in the attaching area BA, so that the step caused by the third black matrix 288c and the fourth black matrix 288d is disposed only in the boundary area between the edge area of the display area AA and the attaching area BA of the display device, not in the display area AA. Thus, even when the light is absorbed because of the step, it is not displayed on the screen.

Further, in this embodiment, since the second black matrix 288b is spaced apart from the end of the first black matrix 288a by the predetermined distance d1, it is possible to decrease the step caused by the first black matrix 288a and the second black matrix 288b, thereby the spots caused by the step is not occur in the display area AA.

In addition, since the fourth black matrix 288d is also spaced apart from the end of the third black matrix 288c by the predetermined distance d3, it is possible to decrease the step caused by the third black matrix 288c and the fourth black matrix 288d in the display area AA and the attaching area BA.

As described above, in this embodiment, the third black matrix 288c and the fourth black matrix 288d are formed on the second black matrix 288b to prevent the tearing-off of the first black matrix 288a and the second black matrix 288b, and the ends of the third black matrix 288c and the fourth black matrix 288d is spaced apart from the ends of the first black matrix 288a and the second black matrix 288d to minimize the step so as to prevent the problems of spots and the air bubbles caused by the step.

In addition, in this embodiment, the third black matrix 288c and the fourth black matrix 288d are formed only in the attaching area BA, not in the display area AA where the image is actually display, so that the bobbles are not display on the screen even when the bobbles are generated by the third black matrix 288c and the fourth black matrix 288d.

The first black matrix 288a and the second black matrix 288b are formed in the thickness t2, and the third black matrix 288c and the fourth black matrix 288d are formed in the thickness t3. The thickness t2 of the first black matrix 288a and the second black matrix 288b may be about 8-12 μm, preferably about 10 μm. Further, the thickness t3 of the third black matrix 288c and the fourth black matrix 288d may be about 10 μm or more. However, the thickness t2 and t3 are not limited to these values.

Comparing the thickness t2 of the first black matrix 288a and the second black matrix 288b in the second embodiment with the thickness t1 of the first black matrix 188a and the second black matrix 188b in the first embodiment, the thickness t2 of the first black matrix 288a and the second black matrix 288b in the second embodiment is about 10 μm and the thickness t1 of the first black matrix 188a and the second black matrix 188b in the first embodiment is about 14-16 μm, so that the thickness t2 of the first black matrix 288a and the second black matrix 288b in the second embodiment is decreased comparing the thickness t1 of the first embodiment.

Table 1 shows materials and thermal expansion coefficient of optical adhesive layers, the first black matrix 288a and the second black matrix 288b, and the third black matrix 288c and the fourth black matrix 288d applied to the display device according to the second embodiment of the invention.

TABLE 1

| | material | thermal expansion coefficient ($10^{-6}$ m/m · K) |
|---|---|---|
| adhesive | Urethane based material | 50-80 |
| first and second black matrices | polyester based material | 124 |
| third and fourth black matrices | epoxy based material acryl based material | 45-65 68-75 |

As shown in Table 1, in the display device according to the second embodiment of the invention, a urethane based material is used for the optical adhesive layer and a polyester based material is used for the first black matrix 288a and the second black matrix 288b. Further, an epoxy based or a acrylic based materials is used for the third black matrix 288c and the fourth black matrix 288d.

Where the coefficient of thermal expansion of the urethane based material for the optical adhesive layer is about 50-80, the coefficient of thermal expansion of the polyester based material for the first black matrix 288a and the second black matrix 288b is about 124, and the coefficient of thermal expansion of the epoxy material or the acryl based material for the third black matrix 288c and the fourth black matrix 288d is respectively about 46-65 and about 68-75.

The tearing problem of the black matrix is due to the difference in the coefficient of thermal expansion between adjacent layers. That is, when high temperature heat is applied to test the reliability of the display device, the black matrix is torn off due to the difference of thermal expansion coefficient between adjacent layers.

In the embodiment of the invention, the adhesive for attaching the display device is coated on the second black matrix 188b. Since the coefficient of thermal expansion of the adhesive is about 50-80 and the coefficient of thermal expansion of the second black matrix 188b is about 124, the difference of the coefficient of thermal expansion between the adjacent adhesive and the second black matrix 188b about 44-74 which is relatively large value. Due to this large difference of the coefficient of thermal expansion, the first black matrix 288a and the second black matrix 288b are tearing off from the adhesive and then the first black matrix 288a and the second black matrix 288b are torn off when the heat is applied.

On the contrary, in the second embodiment of the invention, the adhesive is coated in the upper region of the third black matrix 288c and the fourth black matrix 288d, which are the attaching area BA. The coefficient of thermal expansion of the adhesive is about 50-80 and the coefficient of thermal expansion of the third black matrix 188c and the fourth black matrix 188d is about 45-65 (in case of the epoxy based material) or about 68-75 (in case of the acryl based material).

Accordingly, the difference in coefficient of thermal expansion between the adhesives and the third black matrix 288c and the fourth black matrix 288d is about 5-35 or about 5-25. Comparing with the first embodiment, this difference in coefficient of thermal expansion is very small value. When high temperature heat is applied to test the reliability of the display device, it is possible to prevent the separation of the third black matrix 288c and the fourth black matrix 288d from the adhesive due to the small difference in coefficient of thermal expansion, thereby the third black matrix 288c and the fourth black matrix 288d is not torn off.

The most important feature of the display device according to the second embodiment of the invention is that the first black matrix 288a and the second black matrix 288b formed in the attaching area BA and the edge area of the display area AA is made of the polyester based material of which the difference in thermal expansion coefficient from the adhesive is large, and the boundary characteristics and the light blocking characteristics are relatively good. Further, the third black matrix 288c and the fourth black matrix 288d formed only in the attaching area BA is made of the epoxy based material or the acryl based material of which the difference in thermal expansion coefficient from the adhesive is small, and the boundary characteristics and the light blocking characteristics are relatively bad. Therefore, the advantages of the first black matrix 288a and the second black matrix 288b (that is, the boundary characteristics and the light blocking characteristics) and the advantages of the third black matrix 288c and the fourth black matrix 288d (small difference in thermal expansion coefficient) can be achieved.

Accordingly, in the display device according to the second embodiment of the invention, it is possible to prevent the pinholes in the black matrix and tearing off the black matrix 288. Further, it is also possible to prevent problems such as the air bubbles defect and the spots caused by increasing the step.

In this respect, the invention is not limited to the structure shown in FIG. 5. That is, the black matrix having various structures may be made of material having the good boundary characteristics and light blocking characteristics and the large difference in thermal expansion coefficient having the relatively bad boundary characteristics and light blocking characteristics and the small difference in thermal expansion coefficient.

Figure 7A:
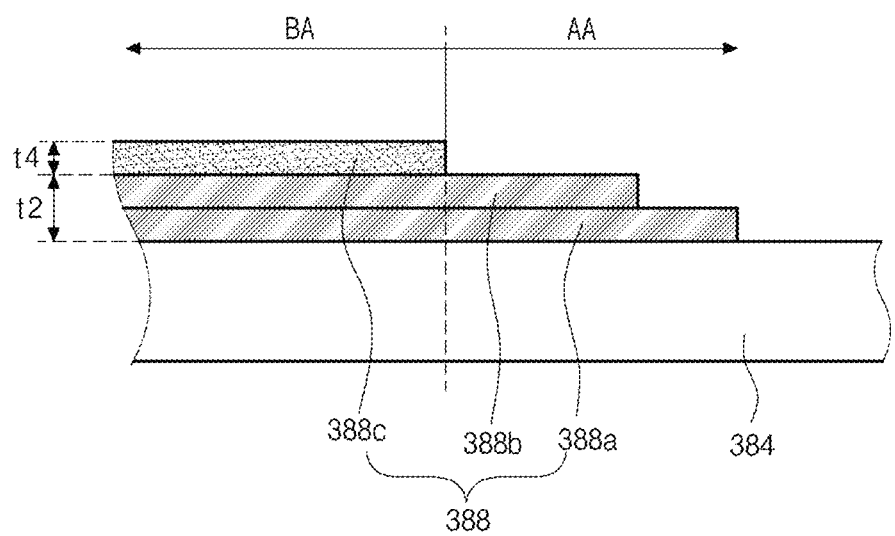
FIGS. 7A and 7B are views illustrating respectively the structure of the black matrix according the third embodiment of the invention.
Figure 7B:
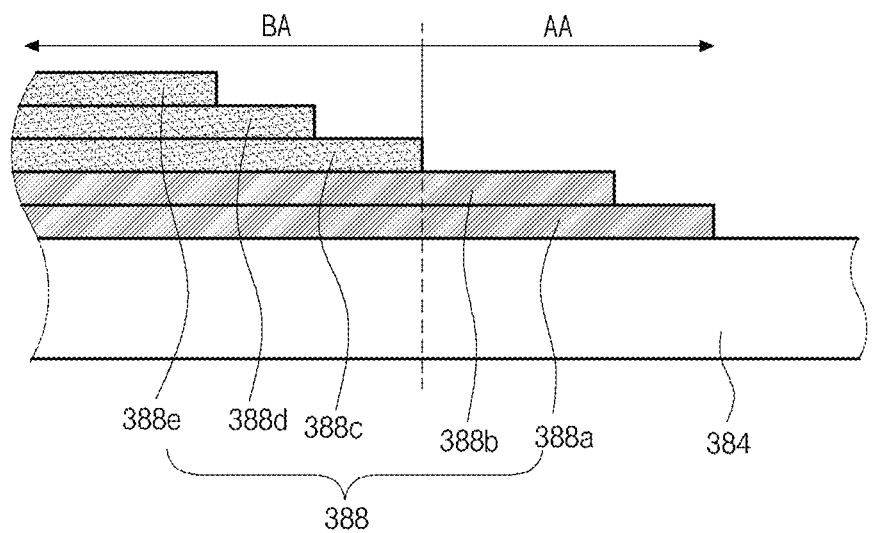

FIGS. 7A and 7B are views each illustrating a structure of the black matrix 388 of the display device according to third embodiment of the invention.

As shown FIG. 7A, in this embodiment, the first black matrix 388a and the second black matrix 388b are made of material having the good boundary characteristics and light blocking characteristics and the large difference in thermal expansion coefficient, such as the polyester based material, and the third black matrix 388c are made of material having the relatively bad boundary characteristics and light blocking characteristics and the small difference in thermal expansion coefficient, such as the epoxy based material or the acryl based material.

In this embodiment, the first black matrix 388a and the second black matrix 388b are formed in the edge area of the display area AA and the attaching area BA, and the third black matrix 388c is formed only in the attaching area BA.

Two layers of black matrices 288c and 288d are formed in the attaching area BA above the second black matrix 288b in the second embodiment, whereas only one layer of the third black matrix 388c is formed in this embodiment. Accordingly, the thickness t2 of the first black matrix 388a and the second black matrix 388b is the same as that of the second embodiment, but the thickness t4 of the third black matrix 388c may be equal to or smaller than the thickness t3 of the third black matrix 288c and the fourth black matrix 288d of the second embodiment (t4≤t3).

The first black matrix 388a to the third black matrix 388c in this embodiment can have the effect same as first black matrix 288a to the fourth black matrices 288d of the second embodiment. Thus, in this embodiment, it is possible to prevent the pinholes in the black matrix 388, tearing off the black matrix 388, and the defect caused by increasing the step (that is, the air bubbles and the spots).

As shown FIG. 7B, in this embodiment, the first black matrix 388a and the second black matrix 388b are made of material having the good boundary characteristics and light blocking characteristics and the large difference in thermal expansion coefficient, such as the polyester based material, and the third black matrix 388c to fifth black matrix 388e are made of material having the relatively bad boundary characteristics and light blocking characteristics and the small difference in thermal expansion coefficient, such as the epoxy based material or the acryl based material.

In this embodiment, the first black matrix 388a and the second black matrix 388b are formed in the edge area of the display area AA and the attaching area BA, and the third black matrix 388c to the fifth black matrix 388e are formed only in the attaching area BA.

The first black matrix 388a to the fifth black matrix 388e in this embodiment can have the effect same as first black matrix 288a to the fourth black matrices 288d of the second embodiment. Thus, in this embodiment, it is possible to prevent the pinholes in the black matrix 388, tearing off the black matrix 388, and the defect caused by increasing the step (that is, the air bubbles and the spots).

As described above, in the invention, the black matrix made of the material having a low coefficient of thermal expansion similar to the adhesive is composed of 1-3 layers, but is not limited thereto, and may be formed in 4 or more layers.

The display device according to the embodiment of the invention may comprise a cover window including a display area and an attaching area, at least one display panel in the display area of the cover window, a first black matrix in an edge area of the display area and the attaching area, a second black matrix in the attaching area over the first black matrix, and an adhesive on the second black matrix, wherein a first difference of coefficient of thermal expansion between the second black matrix and the adhesive may be small than a second difference of coefficient of thermal expansion between the first black matrix and the adhesive.

According to other feature of the invention, the cover window may be made of a glass or a polymer material.

According to another feature of the invention, the cover window may include spherical or aspherical surface.

According to another feature of the invention, the first black matrix may be composed of two layers and the ends of the first black matrices may be space apart to each other.

According to another feature of the invention, the second black matrix may be composed of single layer or multi layers and the ends of a plurality of the second black matrices may be space apart to each other.

According to another feature of the invention, the adhesive may be made of an urethane based material.

According to another feature of the invention, the first black matrix may be made of a polyester based material and the second black matrix may be made of an epoxy based material or an acryl based material.

According to another feature of the invention, the display panel may be a flexible display panel.

According to another feature of the invention, a back plate may be attached to the lower surface of the display panel.

According to another feature of the invention, the first black matrix may be formed in thickness of about 8-12 μm and the second black matrix may be formed in thickness of about 10 JIM or more.

Various modifications of the specification or structures that can be easily created based on the specification should also be included in the scope of the specification. Accordingly, the scope of the rights of the specification should not be determined by the above detailed description, but should be determined by the appended claims. Features, structures, effects, and the like described in the examples of the present application are included in at least one example, and are not necessarily limited to only one example. Further, the features, structures, effects, and the like exemplified in at least one example of the present application may be combined or modified for other examples by person skilled in the art to which the present application belongs. Accordingly, contents related to such combinations and modifications should be construed as being included in the scope of the present application.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
a display panel including a display area for displaying an image;
a cover window on the display panel, the cover window including a portion in an attaching area and not covering the display panel in a cross-sectional view;
a back plate under the display panel;
an adhesive layer between the display panel and the cover window; and
a black matrix between a lower surface of the cover window and an upper surface of the display panel, the black matrix extending from a portion of the display panel to the portion of the cover window in the attaching area,
wherein the black matrix includes a first black matrix and a second black matrix, and
wherein the first black matrix and the second black matrix are stepped toward the display panel.

2. The display device of claim 1, wherein the edge area of the display panel is curved.

3. The display device of claim 1, wherein a substrate of the display panel is flexible.

4. The display device of claim 3, wherein the substrate is formed of a plastic-based material.

5. The display device of claim 1, wherein the first black matrix is closer to the cover window than the second black matrix.

6. The display device of claim 1, wherein the second black matrix is disposed on the first black matrix and spaced a predetermined distance from an edge of the first black matrix.

7. The display device of claim 1, the black matrix further includes a third black matrix and a fourth black matrix overlapped with the first black matrix and the second black matrix in the attaching area.

8. The display device of claim 7, wherein at least one of the third matrix and the fourth matrix is disposed entirely within the attaching area.

9. The display device of claim 7, wherein the third matrix and the fourth matrix are stacked on each other and are stepped with respect to each other in the attaching area.

10. The display device of claim 1, wherein the display panel further includes:
a substrate;
a plurality of light emitting elements disposed on the substrate in the display area;
a bank layer defining each of the plurality of light emitting elements;
a first encapsulation layer made of an inorganic material and disposed on the light emitting elements and the bank layer;
a second encapsulation layer made of an organic material and disposed on the first encapsulation layer; and
a third encapsulation layer made of an inorganic material and disposed on the second encapsulation layer.

11. The display device of claim 10, wherein a spacer is formed between the plurality of light emitting elements on the bank layer.

12. The display device of claim 1, wherein the cover window is made of a glass or a polymer material.

13. The display device of claim 1, wherein the cover window includes a spherical or aspherical surface.

14. The display device of claim 1, wherein the first black matrix is made of a polyester-based material, and the second black matrix is made of an epoxy-based material or an acryl-based material.

15. The display device of claim 1, wherein the first black matrix has a thickness in a range of 8-12 µm, and the second black matrix has a thickness of 10 µm or more.

16. The display device of claim 1, wherein:
the display panel further includes a non-display area outside of the display area;
the display area includes a plurality of pixels, a light emitting element and a thin film transistor being disposed in each of the plurality of pixels; and
the edge area of the display panel is in the non-display area.

17. The display device of claim 1, further comprising:
another display panel under the cover window, the other display panel being spaced apart from the display panel and configured to display an image,
wherein the attaching area is disposed between the display panel and the other display panel in the cross-sectional view.

18. The display device of claim 17, wherein the black matrix extends to an edge area of the other display panel.

19. The display device of claim 1, wherein the first black matrix and the second matrix are not stepped toward the attaching area.

20. A display device, comprising:
a display panel including a display area for displaying an image;
a cover window on the display panel;
a back plate under the display panel;
an adhesive layer between the display panel and the cover window; and
a black matrix between a lower surface of the cover window and an upper surface of the display panel,
wherein the black matrix includes a first black matrix and a second black matrix,
wherein the first black matrix and the second black matrix are stepped toward the display area, and
wherein:
the display panel further includes a non-display area outside of the display area;
the first and second black matrices are stepped in the display area of the display panel; and
the first and second black matrices are not stepped in the non-display area of the display panel.

* * * * *